United States Patent [19]
Ishida

[11] Patent Number: 5,567,986
[45] Date of Patent: Oct. 22, 1996

[54] HEAT SINK

[75] Inventor: Yoshio Ishida, Osaka, Japan

[73] Assignee: Diamond Electric Mfg. Co., Ltd., Osaka, Japan

[21] Appl. No.: 249,353

[22] Filed: May 27, 1994

[30]  Foreign Application Priority Data

Jun. 4, 1993 [JP] Japan .................................. 5-160102
  Sep. 20, 1993 [JP] Japan .................................. 5-257819

[51] Int. Cl.$^6$ .......................... H01L 23/10; H01L 23/34
[52] U.S. Cl. ........................ 257/707; 257/722; 257/706
[58] Field of Search ................................... 257/707, 708, 257/722, 712, 706, 714, 718

[56]  References Cited

U.S. PATENT DOCUMENTS 4,421,161  12/1983  Romania et al. ....................... 257/722

Primary Examiner—Sara W. Crane
Assistant Examiner—S. V. Clark
Attorney, Agent, or Firm—Longacre & White

[57]  ABSTRACT

A heat sink is provided wherein a heat receiving plate and at least one piece of heat radiating fin are stacked in the heat sink, and an interval between the heat receiving plate and fin is maintained by a number of bosses geometrically disposed on the heat radiating fin. The bottom of each boss is soldered onto the adjacent heat receiving plate or heat radiating fin. The heat sink therefore is provided with a plurality of conductive contacts between said fins and said heat receiving plate in the radial or transverse direction.

23 Claims, 6 Drawing Sheets

HEAT SINK

BACKGROUND OF THE INVENTION

1. Field of the Invention

The present invention relates to a heat sink used for a semiconductor element in a Large Scale Integrated Circuit (LSI) of high testing density provided in a microcomputer driven at high speeds, and also relates to a heat sink used for a semiconductor element used for a thyristor of middle capacity and a power transistor. More particularly, the present invention relates to an air-cooled type compact heat sink in which generated heat is dispersed by air for cooling.

2. Related Art

FIG. 13 is a perspective view and FIG. 14 is a side view of a conventional heat sink mounted on a QFP (Quadrangle Flat Package) type heat generating body (LSI) of a ceramic package. In FIGS. 13 and 14, numeral 90 is a heat sink made of highly heat-conductive material such as aluminum and copper. The heat sink 90 is manufactured by means of machining so that a fin portion 92 is formed in the periphery of a heat-conductive support portion 91. A central portion of the heat-conductive support portion 91 is closely contacted with and mounted on a central surface of the QFP type LSI 93 which is a heat source. Therefore, heat generated by the LSI 93 is radiated by the fin portion 92.

In the heat sink 90 constructed in the manner described above, unless the diameter d1 of the fin portion 92 is extended or the number of the fins is increased in accordance with the increase of heat generated by the LSI 93, that is, unless the surface area of the fin portion 92 of the heat sink 90 is increased, sufficient heat radiating effects can not be provided. However, in the case where the diameter d1 of the heat sink 90 becomes larger than the outer diameter of the LSI 93, or in the case where the height H of the heat sink 90 is increased too much, the significant problems may be encountered. When such a large heat sink 90 is disposed in a limited small space in an electronic apparatus, convection of air is obstructed, so that the cooling capacity is remarkably lowered.

Even when it is permitted that the dimensions of the heat sink 90 are increased, in the case where the diameter dl of the fin portion 92 is simply extended or the number of the fins is simply increased, a distance from the heat source (LSI 93) is increased, so that the heat resistance of the material composing the heat sink 90 is increased. Therefore, it is necessary to increase the thickness t1 of the fin, and to extend the diameter d2 of the heat-conductive support 91. Accordingly, as a measure to be taken against the increase of heat generated in the LSI not only the dimensions of the heat sink are increased but also a large capacity of motor to drive a cooling fan is employed for a forced convection. Consequently, the costs are raised.

The machining of the heat sink 90 is also restricted by the heat sink material, mechanical strength of the cutting tool and cutting accuracy, thus, a ratio of the diameter d2 of the heat-conductive support 91 to the diameter d1 of the fin portion 92 is limited since the fin interval t2 necessary for an appropriate convention must be maintained. For this reason, when the heat sink 90 is made compact, the reduction of thickness t1 of the fin is limited.

Further, in the conventional heat sink 90, it is necessary to provide the heat-conductive support 91. Therefore, heat is accumulated among closely stacked fins under the condition of a natural convection or a gentle wind so that heat is not effectively radiated.

SUMMARY OF THE INVENTION

The present invention overcomes the above problems by providing a heat sink construction which is small and light with improved heat radiating properties.

In order to solve the above problems, the present invention provides a heat sink comprising: a heat receiving plate; and at least one piece of heat radiating fin stacked on said heat receiving plate, wherein an interval between said heat receiving plate and heat radiating fin is maintained by a plurality of bosses geometrically disposed on said fin, and a bottom surface of each boss is soldered onto an adjacent heat receiving plate or fin.

When the bosses are provided on the fin as described above, heat of the heat receiving plate can be effectively conducted to each fin. Therefore, the conventional heat-conductive support 91 is unnecessary, so that an effective heat radiating area of the fin portion 92 is remarkably increased. Since the plurality of bosses can be formed at arbitrary positions on the fin, an increase of heat resistance of the fin can be compensated even when the thickness t1 of the fin is reduced. Due to the effect described above, a small and light heat sink, which is excellent in the heat radiating properties can be provided even when an amount of heat is increased in a semiconductor heat generating element such as an LSI.

When metallic sheets are used for the above heat radiating plates, the costs can be reduced compared with the conventional ones subjected to cutting processing. Further, when the heat radiating plates are replaced with heat pipes, an increase of the dimensions of the entire electronic apparatus can be prevented, which is advantageous in reducing the costs of the system.

DETAILED DESCRIPTION OF THE PREFERRED EMBODIMENTS

Figure 1:
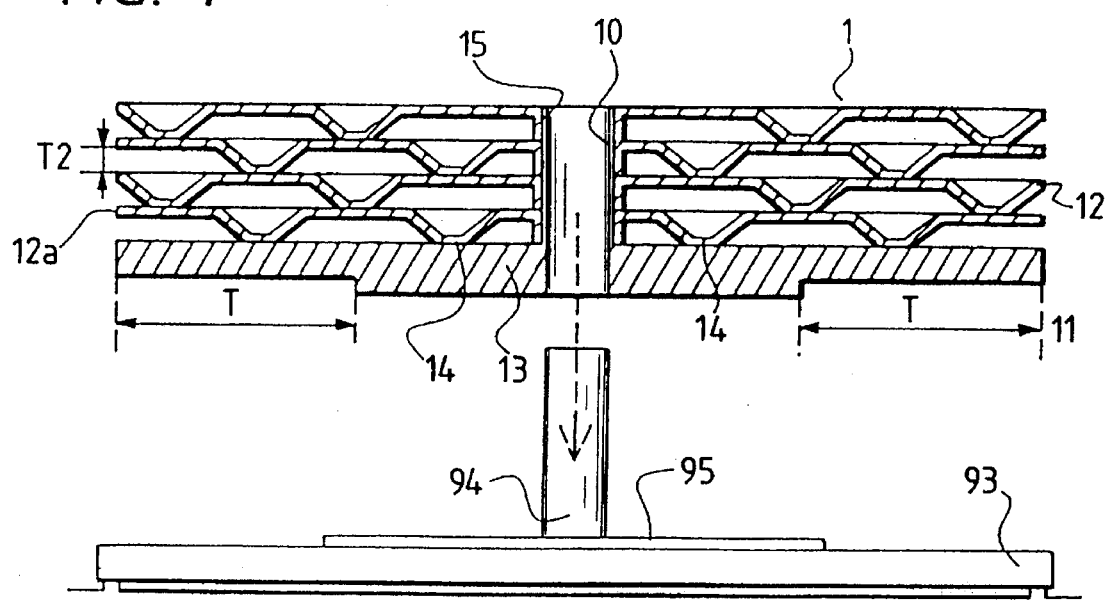
FIG. 1 is a sectional side view of the heat sink of the first embodiment taken along section line I—I of FIG. 2.
Figure 2:
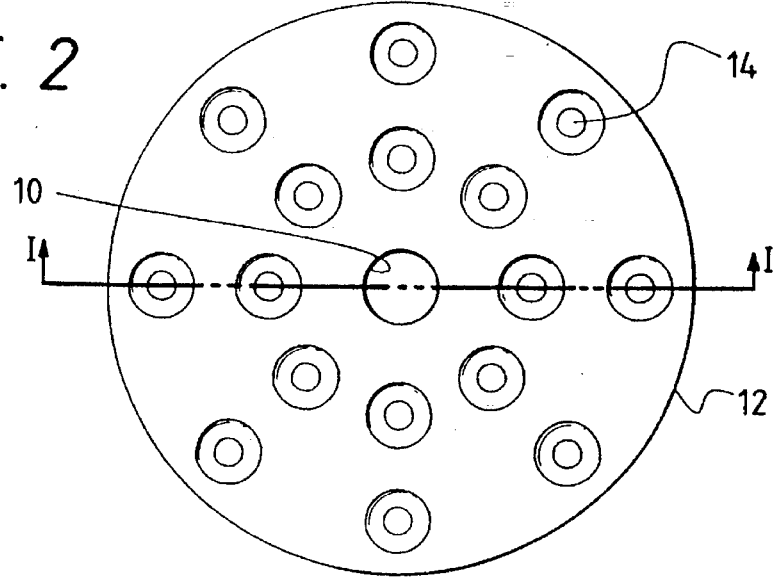
FIG. 2 is an upper view of the heat sink of the first embodiment.
Figure 3:
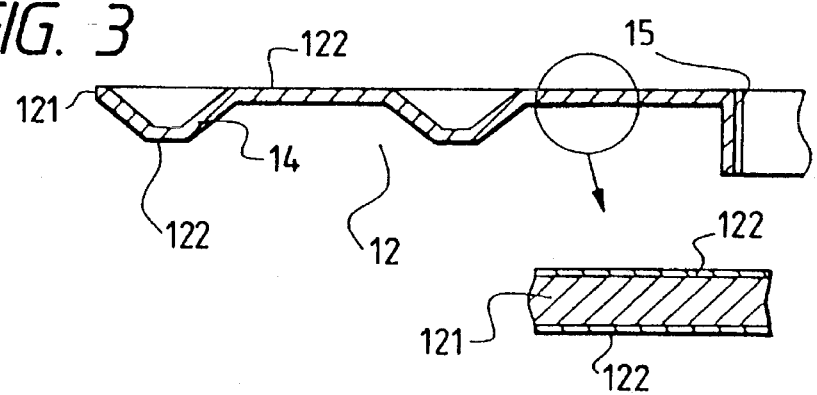
FIG. 3 is an enlarged sectional side view of the heat radiating fin of the first embodiment.

FIG. 1 is a sectional view of the heat sink of the first example of the present invention, FIG. 2 is an upper view, FIG. 3 is a partially enlarged view of the fin shown in FIG. 1.

A heat sink 1 of the first example shown in FIG. 1 is designed for an LSI 93 to be cooled which has a metallic plate 95 onto which a screw portion 94 for joining the heat sink is attached at the center of the ceramic package. At the center of the heat sink 1, a female screw portion 10 is formed for engagement with the screw portion 94 of the LSI 93. A heat receiving plate 11 made of aluminum and a burr portion 15 closely contacted with an outer diameter portion of the female screw portion 10 are provided integrally with the female screw portion 10. Further, the heat sink 1 includes several heat radiating fins 12 composed of a brazing sheet on which a large number of bosses 14 are relatively and uniformly disposed. In the preferred embodiment, a heat receiving surface 13 of the heat receiving plate 11 coming into contact with the metallic plate 95 of the LSI 93 is smaller than the outer diameter of the heat receiving plate 11, so that a convection space (T) can be formed between the heat receiving plate 11 and the LSI 93 for increasing the heat radiating area. As the construction of the heat radiating fin 12 is shown in FIG. 3, both side of a core member 121 of an alloy sheet such as aluminum alloy are covered with solder 122 made of low fusing point alloy. Heat radiating fins 12 are made of the same metal sheet by means of press forming, however, the adjacent fins are stacked in such a manner that the vertical positions of a plurality of bosses 14 do not coincide with each other. Therefore, an interval between the adjacent fins, and that between the heat receiving plate 11 and the fin 12 are equal to a gap (T2) that is the same as the height of the boss 14.

All members of the heat sink 1 shown in FIGS. 1, 2 and 3 are integrated into one body in the following manner: the uppermost heat radiating fin 12 and the lowermost heat receiving plate 11 are provisionally fixed, and put into a furnace, the temperature of which is lower than the fusing point of the core member 121 of the brazing sheet and higher than the fusing point of the solder 122. After the solder 122 has been fused, it is cooled. In this way, the bottom surfaces of the bosses 14 are soldered to the heat radiating fins by the action of solder 122, the bosses 14 and the heat receiving plate 11 are also soldered, and further the outer diameter portion of the female screw 10 and the burr portion 15 are also soldered.

In the above heat sink 1, the female connector 10 is screwed or otherwise suitable affixed to the connector portion 94 of the LSI 93 to be cooled, and heat generated by the LSI 93 is conducted to the heat receiving plate 11 of the heat sink 1 through the metallic plate 95 and the connector portion 94. In this case, heat conducted from the connector portion 94 is mainly conducted outside from the center of the heat radiating fin 12 through the burr portion 15 of each fin. On the other hand, heat is conducted from the metallic plate 95 to the heat receiving plate 11 through the heat receiving surface 13 in the thickness direction, and at the same time, heat is dispersed in the outer circumferential direction of the heat receiving plate 11.

Thickness of the heat receiving plate 11 is appropriately determined in proportion to its diameter, for example, thickness of the heat receiving plate 11 is about 2 mm in the case where the diameter is 50 mm. Therefore, even when an area of the heat receiving surface 13 is small, heat on the heat receiving surface 13 is uniformly conducted all over the heat receiving plate 11. On the other hand, in the case of a heat radiating fin 12 composed of a standard or conventional brazing plate, its thickness is small compared with the thickness of the heat receiving plate 11, that is, the thickness of the standard blazing plate is only 0.5 mm. Accordingly, a sufficient amount of heat cannot be conducted from the burr portion 15 to the outer circumferential portion of each heat radiating fin 12. In other words, the heat conduction is attenuated when heat is conducted to the outer circumferential portion of each heat radiating fin 12. Therefore, the heat radiating efficiency of the prior art fin is lowered.

However, in the case of the heat sink 1 shown in FIG. 1, heat uniformly conducted to the heat receiving plate 11 is conducted to all the surface of the heat radiating fin 12a through a large number of bosses 14a of the heat radiating fin 12 directly coming into contact with the heat receiving plate 11. Successively, heat is conducted or dispersed to upper heat radiating fins through the bosses 14 provided in the fins. In this way, heat is approximately uniformly conducted to the entire heat sink 1, so that the heat is effectively radiated.

In the case of a natural convection, the height of the boss 14 is determined to be approximately 2 mm, and in the case of a forced convection, the height of the boss 14 is determined to be approximately 1.2 mm. Lateral flow of air is preferably provided in order to facilitate cooling. Since each heat radiating fin 12 is formed by means of press forming, it is easy to form a hole for convection in the heat radiating fin 12. Accordingly, when a number of holes for convection are formed in the bottoms of bosses 14 and in the portions of the heat radiating fin 12, the height of the boss 14 can be reduced, that is, the interval (T2) shown in FIG. 1 between the fins can be reduced, so that the overall height of the heat sink 1 can be suppressed. The air resistance of a large number of bosses 14 is small because the diameter of the bottom surface of each boss 14 is 3 to 5 times as large as the wall thickness of the heat radiating fin 12. Consequently, concerning the air resistance of the boss 14, no practical problems are caused. Consideration should be given to the reduction of a heat radiating surface area by increasing the number of the bosses 14.

In the above example, the female connector portion 10 is provided in the heat sink 1 for the purpose of cooling the LSI 93 (semiconductor elements to be cooled), onto the upper surface of which the metallic plate 95 and connector portion 94 are provided. However, according to the present invention, heat conduction is mainly carried out by the relatively thick heat receiving plate 11 and bosses 14 of the heat radiating fin 12. Therefore, a heat sink capable of providing the same effect as described above can be made in the following manner: The heat sink is not, provided with the female connector portion 10, that is, the connector portion is not formed at the center of the heat receiving plate 11, and the heat radiating fin 12 is not subjected to processing for providing the burr portion 15. Therefore, the heat sink 1 includes a flat heat radiating fin 12 having bosses 14 and holes for preventing the accumulation of air, if necessary.

In this case, the heat sink is attached to the heat generating semiconductor element using an adhesive agent such as highly heat-conductive epoxy resin and silver paste, or using silicon grease and an exclusive cramp. In this case, while consideration is given to the adhesive strength,it is preferable that the entire lower surface of the heat receiving plate 11 is closely attached to a heat generating element such as an LSI without forming a step portion on the lower surface, as compared with a design in which the diameter of the heat receiving surface 13 is made smaller than the outer diameter of the heat receiving plate 11 in order to increase the heat radiating area.

Figure 13:
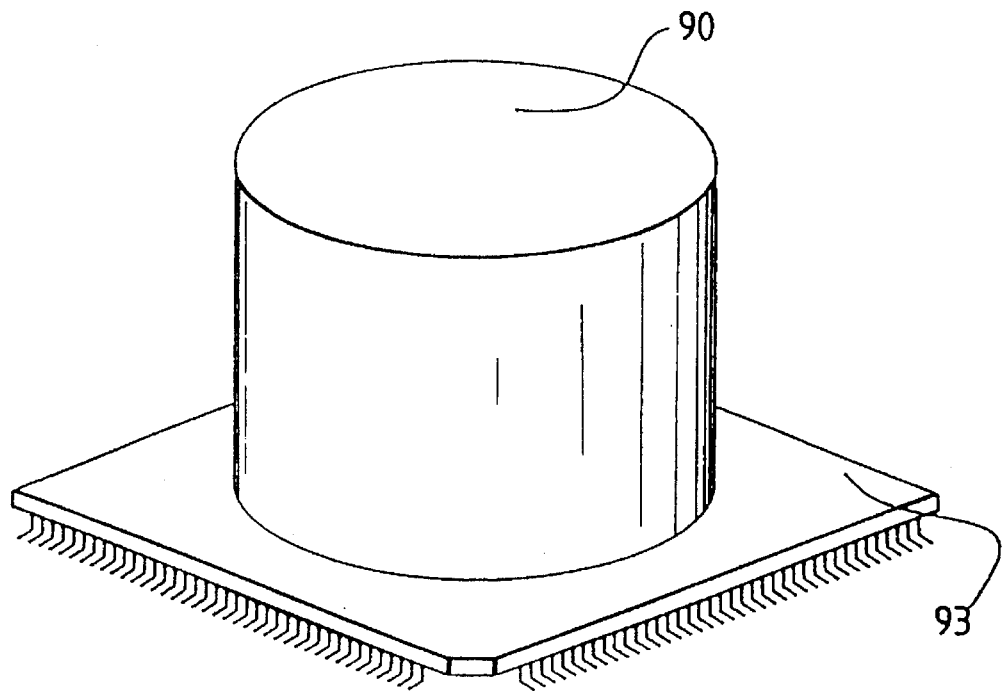
FIG. 13 is a perspective view of a conventional heat sink.
Figure 14:
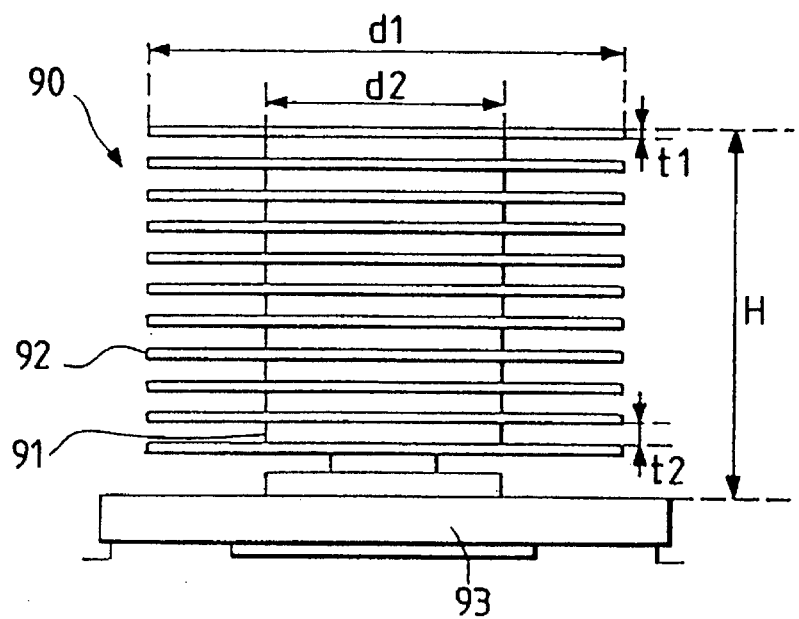
FIG. 14 is aside view of a conventional heat sink.

In the conventional heat sink 90 as shown in FIGS. 13 and 14, it is necessary to provide the heat-conductive support 91.

Figure 4:
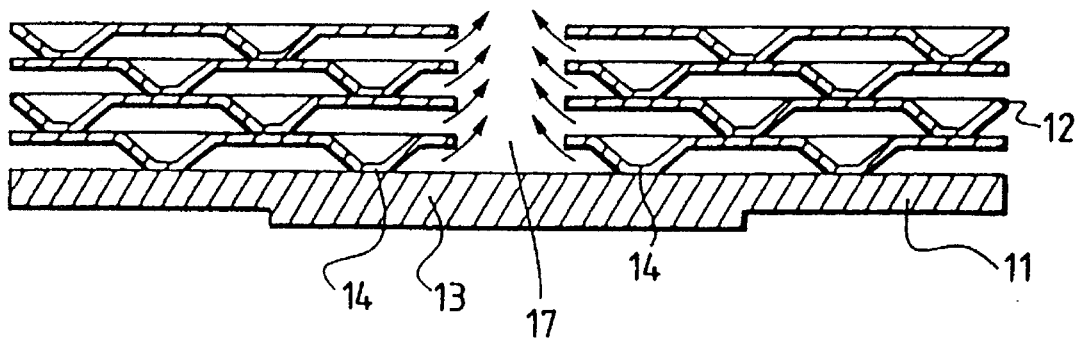
FIG. 4 is a sectional side view of the heat sink.
Figure 5:
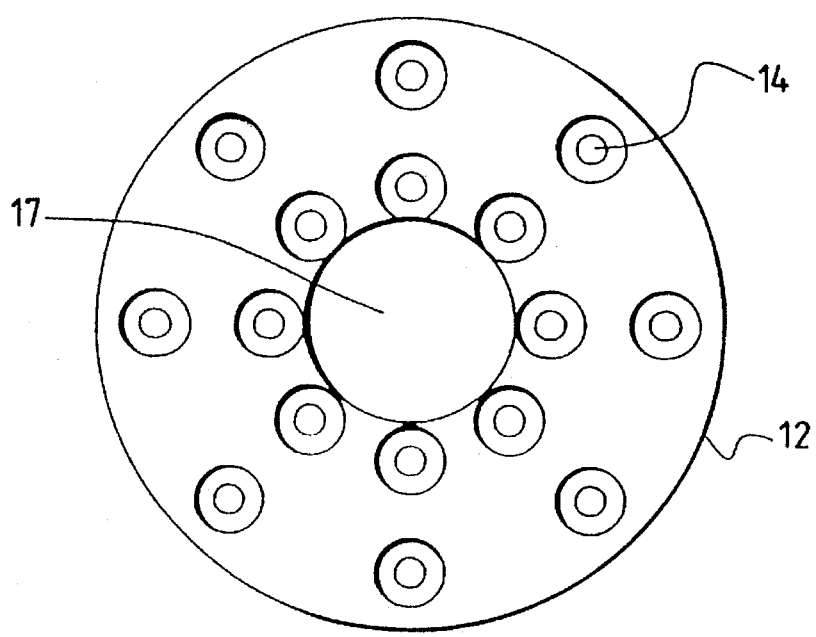
FIG. 5 is a view showing the upper surface of the cover.

Therefore, a heat accumulation is caused in the closely stacked fins under the condition of a natural convection or a gentle wind, so that generated heat can not be effectively radiated. However, in the example of the invention described above, a gap is formed by a large number of bosses 14 between the stacked heat radiating fins 12. Therefore, the construction shown in FIGS. 4 and 5 may be employed, in which the heat-conductive support 91, or the connector portion 94 and burr portion 15 are omitted. FIG. 4 is a side view of the heat sink in which the heat-conductive support 91 illustrated in FIG. 14, or the connector portion 94 and burr portion 15 illustrated in FIG. 1 are omitted. FIG. 5 is an upper view of this heat sink. In FIGS. 4 and 5, the heat-conductive support 91 of the conventional heat sink shown in FIG. 14 is removed so that a space (hole) 17 is formed, and the construction of the heat radiating fin 12 and boss 14 except for the connector portion 94 and burr portion 15, is the same as that described in FIG. 1. Therefore, the explanations are omitted here.

Figure 6:
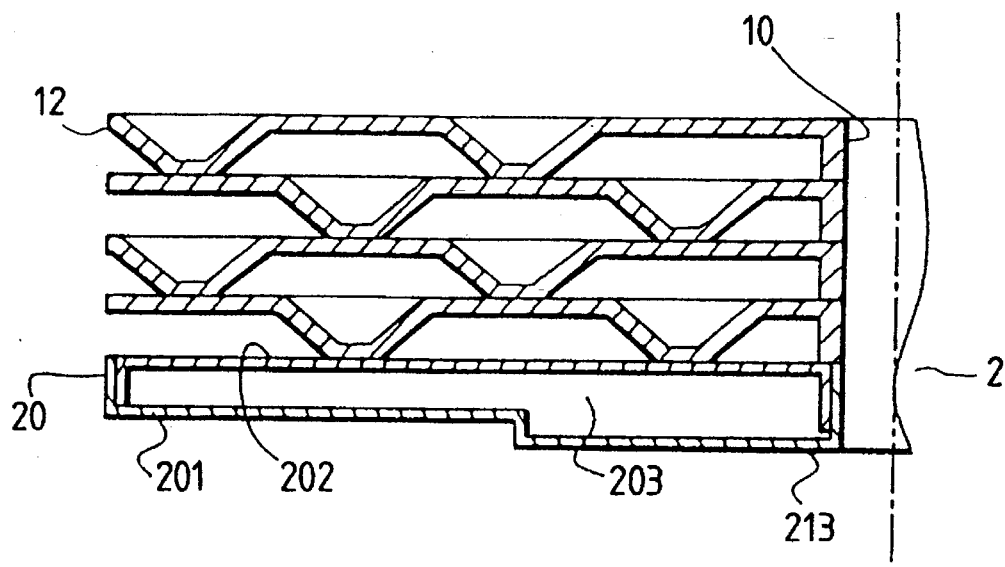
FIG. 6 is a sectional side view of the heat radiating pipes of the second embodiment.
Figure 7:
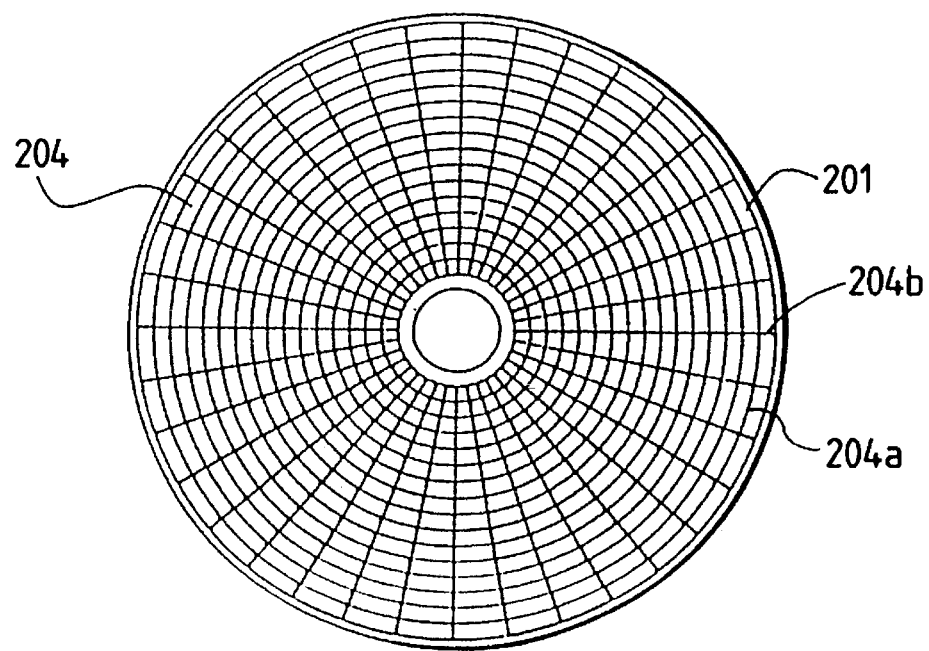
FIG. 7 is a view showing the bottom plate portion of the heat radiating heat pipes of the second embodiment.

FIG. 6 is a sectional view of the heat sink 2 of the second example of the present invention in which a brazing sheet is also applied to the aforementioned heat receiving plate 11. In the case where a heat receiving plate of a large outer diameter is required for the heat receiving plate 11 in the example shown in FIG. 1, a heat receiving plate 20 of heat pipe structure is employed, in which heat can be uniformly conducted even if the heat receiving plate 20 is thin. This heat receiving plate 20 is referred to as "a heat receiving pipe", hereinafter. FIG. 7 is a wick structure diagram of the heat receiving pipe 20 described above.

Outer diameter of the heat receiving pipe 20 is approximately the same as that of the heat receiving plate 11 shown in the first example (FIG. 1), however, the heat receiving pipe 20 includes a wick 204 made of aluminum, in which circumferential and radial grooves, 204a and 204b respectively, are formed from the center to the outer periphery as illustrated in FIG. 7. As illustrated in FIG. 6, the heat receiving heat pipe 20 includes: a bottom plate portion 201 press-formed into a pan-bottom-shape; and a cover plate portion 202 press-formed from a brazing sheet, whereby a space 203 is maintained between the bottom plate portion 201 and the cover plate portion 202, and the space 203 is closed up tightly.

As illustrated in FIG. 6, the heat radiating fins 12 are respectively put on the heat receiving heat pipe 20 formed from bottom plate portion 201 and cover plate portion 202, and provisionally fixed thereon. Then, heat radiating fins 12 are subjected to soldering so that they are integrated into one body. Therefore, the space 203 is formed into a completely closed space. After the space 203 has been vacuumized, the pressure in the space 203 is reduced. Then actuating fluid (not shown) such as acetone and ammonia is injected into the space 203 by an amount of 20% of the space 203 (the injection hole is not shown in the drawing). After that, the heat pipe 20 is soldered so as to be closed up.

Due to the capillary phenomenon of the grooves in the wick 204, actuating fluid in the heat receiving heat pipe 20 approximately uniformly spreads on the inner surface of the bottom plate portion 201. When the heat receiving surface 213 is heated, actuating fluid close to the heat receiving surface 213 evaporates and condenses toward the outer periphery of low temperature, so that the evaporated actuating fluid returns to the state of fluid and passes through the wick grooves, and returns to a position close to the heat receiving surface 213. When this cycle is repeated, heat is uniformly dispersed on the surface of the heat receiving heat pipe 20 in a very short period of time.

Accordingly, even when a large amount of heat is generated by the semiconductor to be cooled and a heat sink 2 of large outer diameter is required, it is not necessary to give consideration to an increase of heat resistance, and the heat sink 2 of large outer diameter can be provided while the profile is maintained in the condition of a thin heat receiving heat pipe 20. In order to solve the problem in which the heat resistance is increased in accordance with an increase of the outer diameter of the heat radiating fin 12, the number of the bosses 14 may be increased and the positions of the bosses 14 may be appropriately selected as explained in the first example.

Figure 8:
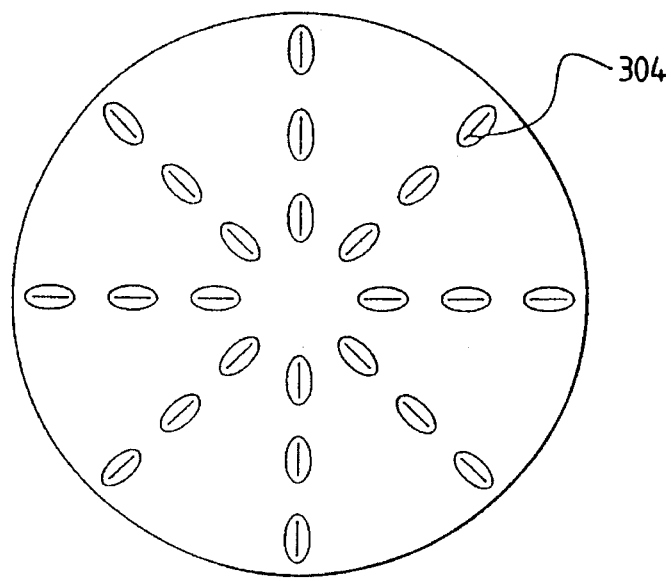
FIG. 8 is a perspective view of the heat sink of the third embodiment.
Figure 9:
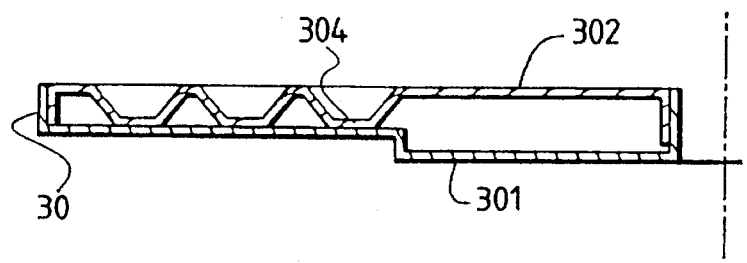
FIG. 9 is a sectional side view of the heat sink of the third embodiment.

FIG. 8 is an upper view, and FIG. 9 is a sectional view of the heat pipe 30 of the third example of the present invention in which a cover plate portion 302 is provided with a wick-shaped cut-out portion 304 while the inner surface of the bottom plate portion 301 (corresponding to bottom plate portion 201 of the second example) is machined so that a wick 304 can be formed.

This example is applied to a case in which the diameter of the heat receiving heat pipe 20 of FIG. 6 is increased so that the mechanical strength must be improved with respect to a force given from the outside and decompression, and also this example is applied to a case in which a brazing sheet is applied to the bottom plate portion 201 (the grooves on the inner surface of the bottom plate portion 201 is filled with solder in the soldering process). In this connection, instead of the cut-out portion 304 in this example, a wire rod and sheet made of aluminum or ceramics may be used in the same manner as a common plate-shaped heat pipe. In this connection, in the third example of FIG. 8, the bottom plate portion 301 is made of a brazing sheet. However, as long as the heat pipe is composed of the bottom plate portion 301, cover plate portion 302 and actuating fluid, either the bottom plate portion 201 or the cover pate portion 202 may be made of a brazing sheet. The brazing sheet including the heat radiating fin 12 may be a sheet, only one side of which is covered with solder.

Figure 10:
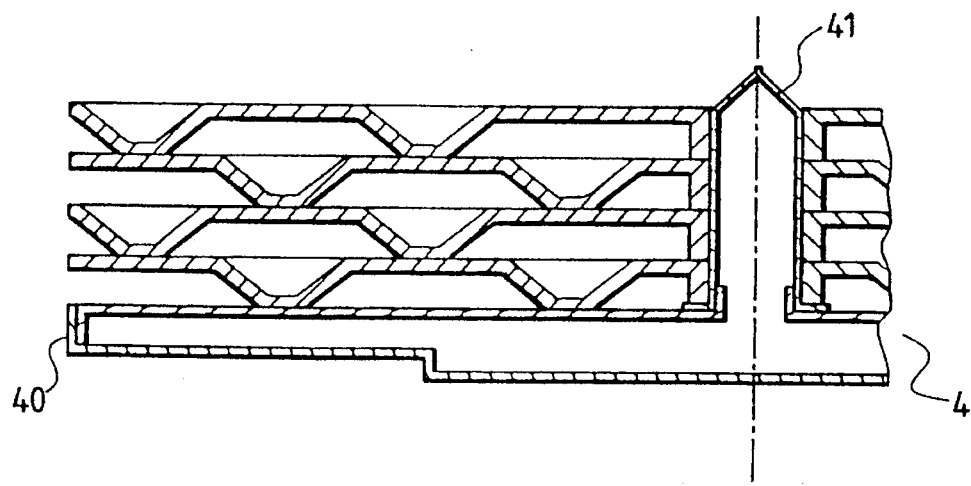
FIG. 10 is a sectional side view of the heat sink of the fourth embodiment.

FIG. 10 is a sectional side view of the heat sink 4 of the fourth example in which an injecting hole 41 for injecting actuating fluid of the heat pipe is disposed approximately at the center of the heat receiving heat pipe 20 in the second example and the heat radiating fin 12 to be stacked is soldered. In FIG. 10, the injection hole 41 for injecting the actuating fluid of the heat receiving heat pipe 20 is provided at a position of the female screw portion 10 of FIG. 1. In this way, the heat receiving heat pipe 40 is constructed. Diameter of the injection hole 41 is determined to be relatively large, so that heat can be easily conducted from the center of the heat sink 4 and further the injection hole 41 can be easily designed.

Figure 11:
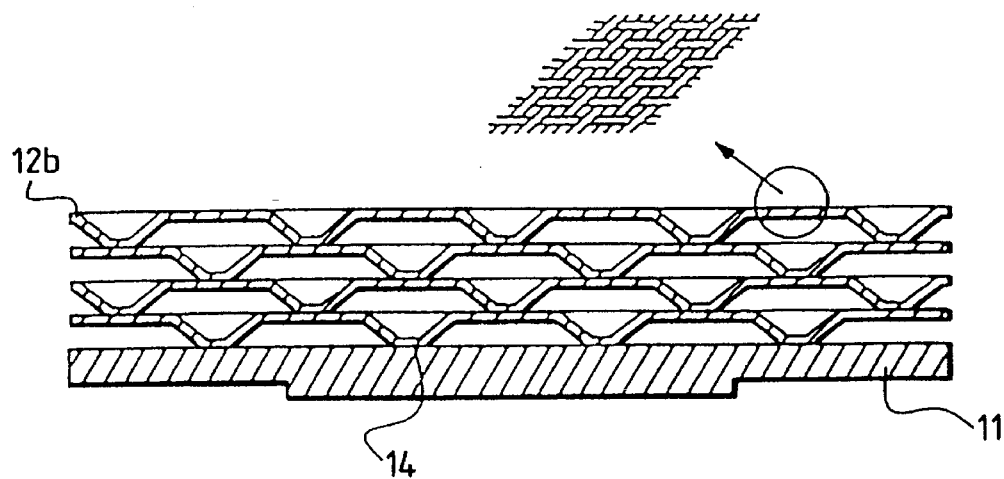
FIG. 11 is a side view of the heat sink having a radiating fin made of the wire net and an enlarged view of the wire net portion.

In the heat sink described above, the core 121 of the heat radiating fin 12 is formed of a flat sheet made of aluminum alloy. However, this core 121 may be formed of a fused wire net made of copper or aluminum having apertures illustrated in FIG. 11.

Figure 12:
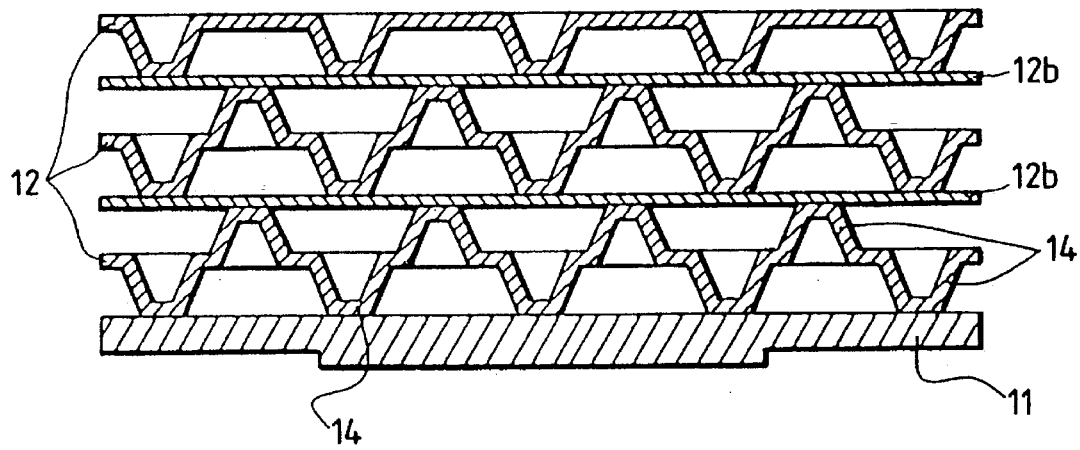
FIG. 12 is a side view of the heat sink having the wire net type heat radiating fins and the flat-shaped type heat radiating fins stacked together with each other.

As shown in the first example, holes for air convection may be formed in a portion of the flat-sheet-shaped heat radiating fin 12. However, when the wire net type and flat-shaped type are combined as illustrated in FIG. 12, soldering work can be easily carried out. In FIG. 12, on the upper surface (heat radiating surface) of the heat receiving plate 11, the flat-sheet-shaped heat radiating fins 12 having appropriate punched holes and bosses 14, and the cores 121 are alternately stacked together with the wire net type heat radiating fins 12b. The bosses 14 are provided on the upper and lower surfaces of the flat-sheet-shaped heat radiating fin 12. Alternatively, the bosses 14 are provided on one of the upper and lower heat radiating surfaces of the flat-sheet-shaped heat radiating fin 12 and the wire net type heat radiating fin 12b.

In general, the heat receiving plate 11 of the heat sink is attached to a package of the existent LSI (heat generating body) made of metal such as aluminum. However, when the aforementioned heat receiving plate 11 is composed of a ceramic plate made of alumina, aluminum nitride and silicon carbide so that the thermal expansion coefficient can be the same as that of the semiconductor chip, and when the heat receiving plate 11 is directly joined with the semiconductor chip such as an LSI, the cooling effect can be more improved. At this time, the heat receiving plate 11 formed of the ceramic plate described above, and the heat radiating fin 12 can be relatively easily joined when the joining sides of the heat receiving plate 11 and heat radiating fin 12 are subjected to printing sintering of metal such as nickel alloy.

As described above, according to the present invention, a highly heat-conductive heat receiving plate and heat radiation fin are soldered at an arbitrary position. Therefore, the mechanical strength of the heat sink is high, and the surface area of the heat sink is large so that heat can be uniformly dispersed, and further the dimension and weight of the heat sink can be reduced. When the heat-conductive support 91 is omitted, a heat accumulation is not caused and a convection is facilitated even under the condition of a natural convection of a gentle wind, so that an effective convection for cooling the heart sink can be provided.

The heat sink of the present invention is not manufactured by means of cutting, but it is mainly manufactured by means of press forming and soldering. Therefore, even when a heat pipe is used for the heat receiving plate, the heat sink can be supplied at relatively low costs so that it can be applied to the semiconductor of mass production. In this connection, the heat sink of the example of the present invention is circular as shown in the upper view. However, when the profile is square or polygonal, the heat radiating area can be arbitrarily increased.

In general, an interval between the adjacent heat radiating fins 12 is determined by the height of one piece of boss 14. However, when the opposed bosses 14 of the heat radiating fins 12 are butted at the same position, the interval of the stacked heat radiating fins 12 can be increased.

When an interval between the heat radiating fins 12 is reduced in the conventional heat sink, air is accumulated between the fins, so that the fin effect is lowered. However, when the heat radiating fin 12 is formed into a shape of wire net, or a hole for convection is formed in the heat radiating fin 12, accumulation of air in the heat sink can be reduced, so that the heat radiating area can be increased. In this way, a compact heat sink of high efficiency can be provided.

While the invention has been particularly shown and described with reference to several preferred embodiments, it will be understood by those skilled in the art that various changes in form and detail may be made without departing from the spirit and scope of the invention.

What is claimed is:

1. A heat sink comprising: a heat receiving plate; and a heat radiating means for radiating heat from a heat generating body stacked on said heat receiving plate, wherein an interval between said heat receiving plate and said heat radiating means is defined by a plurality of bosses geometrically disposed on said heat radiating means, said plurality of bosses being integrally formed on said heat radiating means, wherein a bottom surface of each boss is soldered onto said heat receiving plate.

2. The heat sink according to claim 1, wherein said heat radiating means comprises a fin formed as a brazing sheet, said brazing sheet defined by a core material and a soldering material disposed thereon, said core material having a higher melting point than said soldering material.

3. The heat sink according to claim 1, wherein a hole for air convection is formed on said heat radiating means.

4. The heat sink according to claim 1, wherein said heat receiving plate is formed into a heat pipe structure.

5. The heat sink according to claim 1, wherein said heat receiving plate comprises a heat pipe including a bottom plate, cover plate and actuating fluid, at least one of said bottom plate and cover plate being formed as a brazing sheet having a core material and a soldering material disposed thereon.

6. The heat sink according to claim 1, wherein said heat receiving plate is formed into a heat pipe structure, an injection hole for actuating fluid is formed approximately at the center of said heat receiving plate, and said heat receiving plate is soldered to said heat radiating means.

7. The heat sink according to claim 1, wherein a core member of said heat radiating means is composed of a fused wire net having apertures.

8. The heat sink according to claim 1, wherein said heat receiving plate is made of ceramics.

9. A heat sink comprising: a heat receiving plate defining a planar surface; and a heat radiating means for radiating heat from a heat generating body provided on said heat receiving plate, and a convection space provided between said heat receiving plate and said heat radiating means, wherein said heat receiving plate contacts said heat radiating at a plurality of discrete locations disposed along said planar surface, wherein said discrete locations are radially disposed about a geometric center point of said planar surface, and said discrete locations are radially symmetric with respect to said geometric center point.

10. The heat sink according to claim 9, wherein said heat radiating means comprises a plurality of fins mounted onto said heat receiving plate, each fin defining a fin surface.

11. The heat sink according to claim 9, wherein said fin surface is substantially parallel to said planar surface.

12. The heat sink according to claim 11, wherein said plurality of fins are respectively stacked on said heat receiving plate, and contact an adjacent fin at a plurality of discrete locations disposed along said fin surface.

13. The heat sink according to claim 12, wherein said heat radiating means is soldered to said heat receiving means at said discrete locations.

14. The heat sink according to claim 9, wherein said heat receiving plate comprises a heat pipe including a bottom plate, cover plate and actuating fluid.

15. The heat sink according to claim 14, wherein said bottom plate is formed with groove means for receiving said actuating fluid, said groove means being formed into said bottom plate.

16. The heat sink according to claim 15, wherein said groove means define circumferential and radial grooves, said actuating fluid passing through said groove during convection of said actuating fluid.

17. The heat sink according to claim 9, wherein said heat radiating means comprises a core member having a surface layer disposed thereon, said surface layer being a soldering material.

18. The heat sink according to claim 9, wherein a core member of said heat radiating means is composed of a fused wire net having apertures.

19. The heat sink according to claim 1, wherein said plurality of bosses protrude from a planar surface of said heat radiating means, said plurality of bosses being formed by press forming.

20. The heat sink according to claim 1, wherein said heat radiating means comprises a plurality of fins stacked on said heat receiving plate, each fin comprising said plurality of bosses.

21. The heat sink according to claim 9, wherein said planar surface is circular.

22. The heat sink according to claim 9, wherein said planar surface is non-circular.

23. The heat sink according to claim 9, wherein said geometric center point is defined by a screw portion passing through said heat receiving plate and said heat radiating means.

* * * * *